US008630106B2

(12) United States Patent
Minamoto et al.

(10) Patent No.: US 8,630,106 B2
(45) Date of Patent: Jan. 14, 2014

(54) SEMICONDUCTOR MEMORY DEVICE WITH MEMORY CELLS EACH INCLUDING A CHARGE ACCUMULATION LAYER AND A CONTROL GATE

(75) Inventors: Takatoshi Minamoto, Yokohama (JP); Toshiki Hisada, Yokohama (JP); Dai Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 369 days.

(21) Appl. No.: 12/695,623

(22) Filed: Jan. 28, 2010

(65) Prior Publication Data

US 2010/0195391 A1    Aug. 5, 2010

(30) Foreign Application Priority Data

Jan. 30, 2009   (JP) ................................. 2009-019678

(51) Int. Cl.
*G11C 5/06* (2006.01)
(52) U.S. Cl.
USPC ........................................ 365/63; 365/185.17
(58) Field of Classification Search
None
See application file for complete search history.

(56) References Cited

U.S. PATENT DOCUMENTS

| | | | | |
|---|---|---|---|---|
| 5,568,420 A | * | 10/1996 | Lim et al. .................. | 365/185.17 |
| 5,740,107 A | * | 4/1998 | Lee ........................... | 365/185.11 |
| 6,507,508 B2 | * | 1/2003 | Hosono et al. .................. | 365/63 |
| 7,245,534 B2 | * | 7/2007 | Goda et al. ............... | 365/185.17 |
| 7,315,472 B2 | * | 1/2008 | Lee ........................... | 365/185.17 |
| 2002/0051402 A1 | | 5/2002 | Hosono et al. | |
| 2008/0094900 A1 | | 4/2008 | Nakamura et al. | |
| 2009/0161427 A1 | | 6/2009 | Nakamura et al. | |

FOREIGN PATENT DOCUMENTS

| JP | 2002-63795 | 2/2002 |
|---|---|---|
| JP | 2002-141477 | 5/2002 |
| JP | 2008-103643 | 5/2008 |

OTHER PUBLICATIONS

Japanese Office Action issued Mar. 19, 2013, in Japan Patent Application No. 2009-019678 (with English translation).
Japanese Office Action mailed Oct. 15, 2013 in a corresponding Japanese Application No. 2009-019678 (with English translation).

* cited by examiner

*Primary Examiner* — Alexander Sofocleous
(74) *Attorney, Agent, or Firm* — Oblon, Spivak, McClelland, Maier & Neustadt, L.L.P.

(57) ABSTRACT

A semiconductor memory device includes a memory cell unit, word lines, a driver circuit, and first transistors. The word lines are connected to the control gates of 0-th to N-th memory cells. The (N+1) number of first transistors transfer the voltage to the word lines respectively. Above one of the first transistors which transfers the voltage to an i-th (i is a natural number in the range of 0 to N) word line, M (M<N) of the word lines close to the i-th word line pass through a region above the gate electrode by a first level interconnection without passing over the impurity diffused layers.

14 Claims, 14 Drawing Sheets

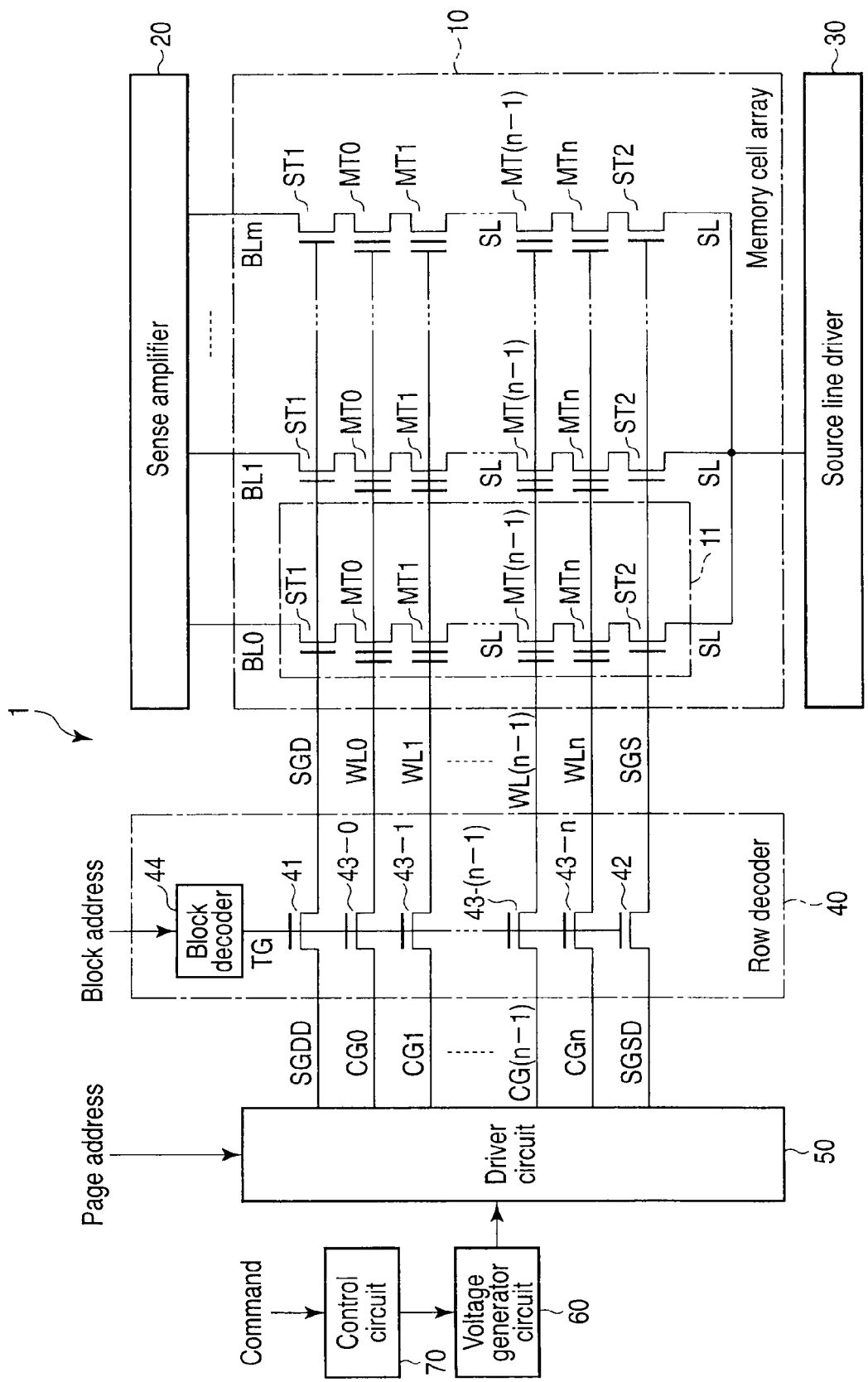
F I G. 1

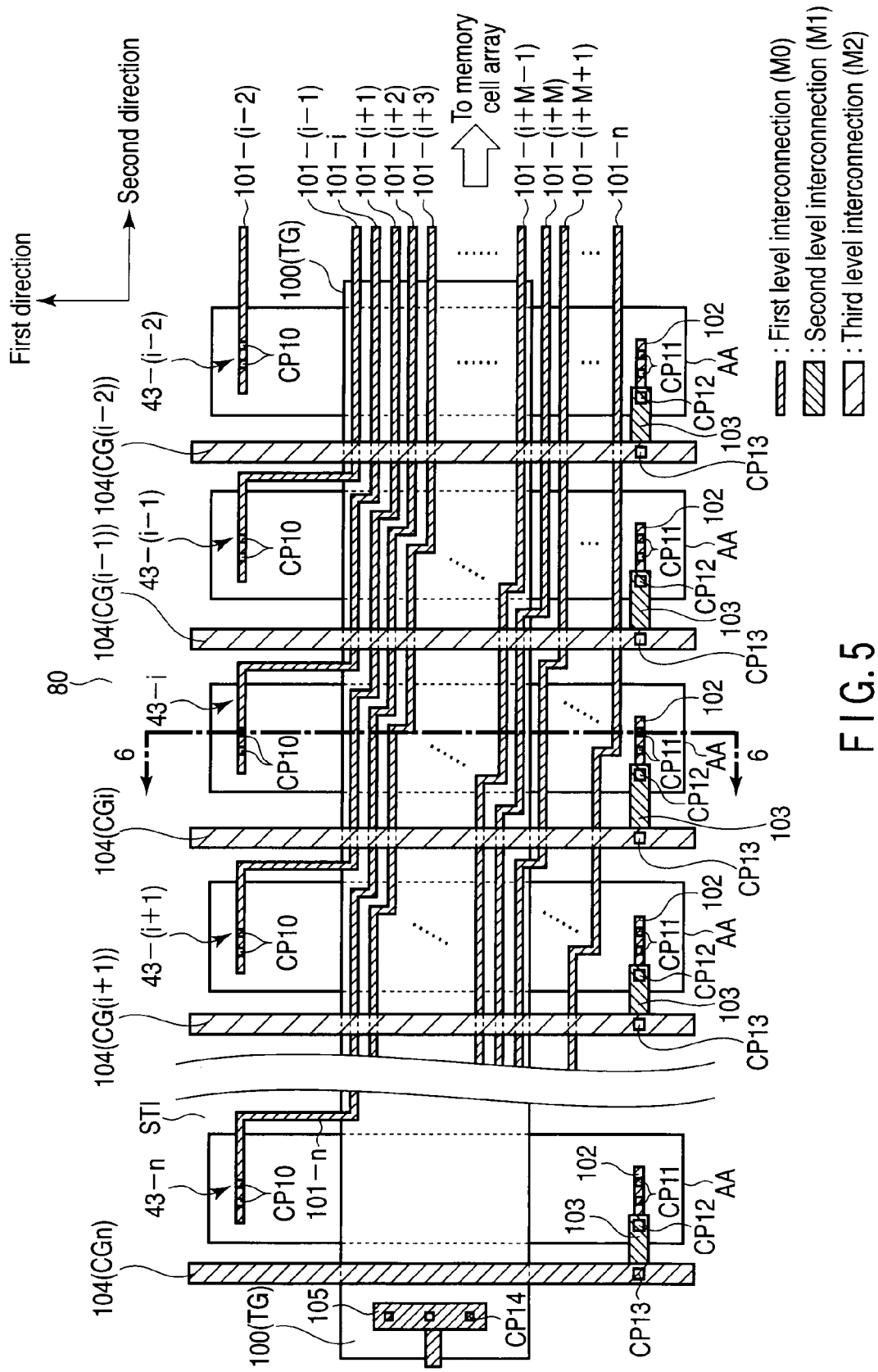
F I G. 5

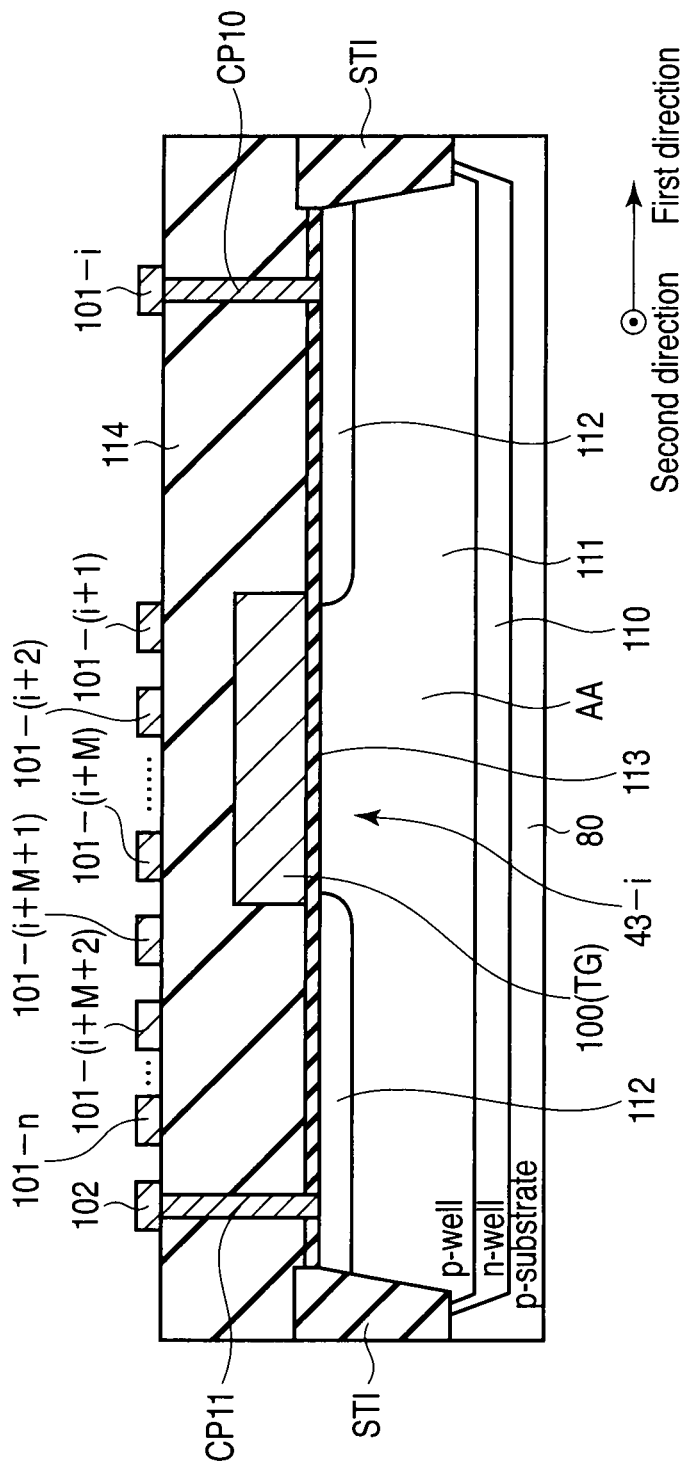
F I G. 6

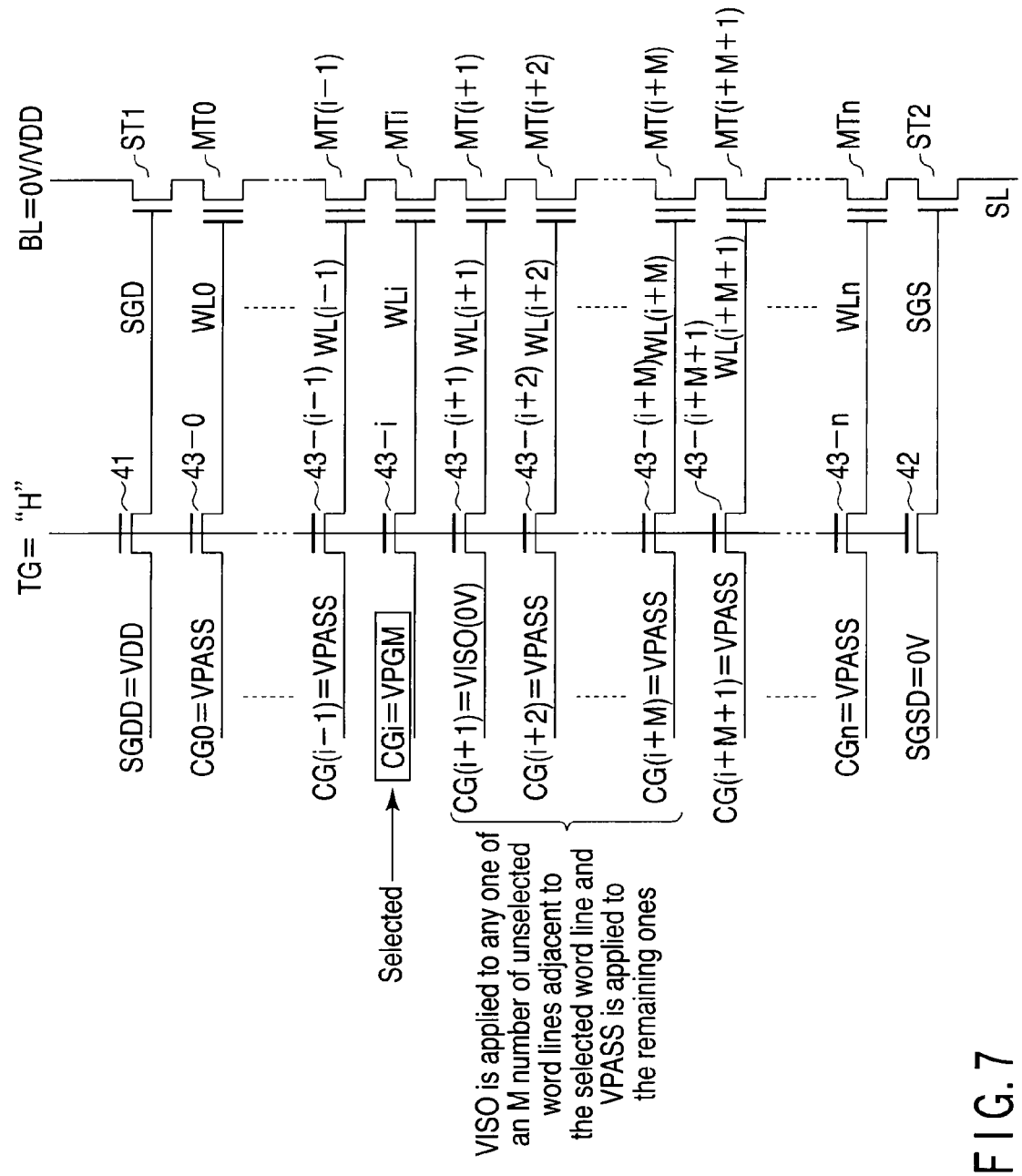
F I G. 7

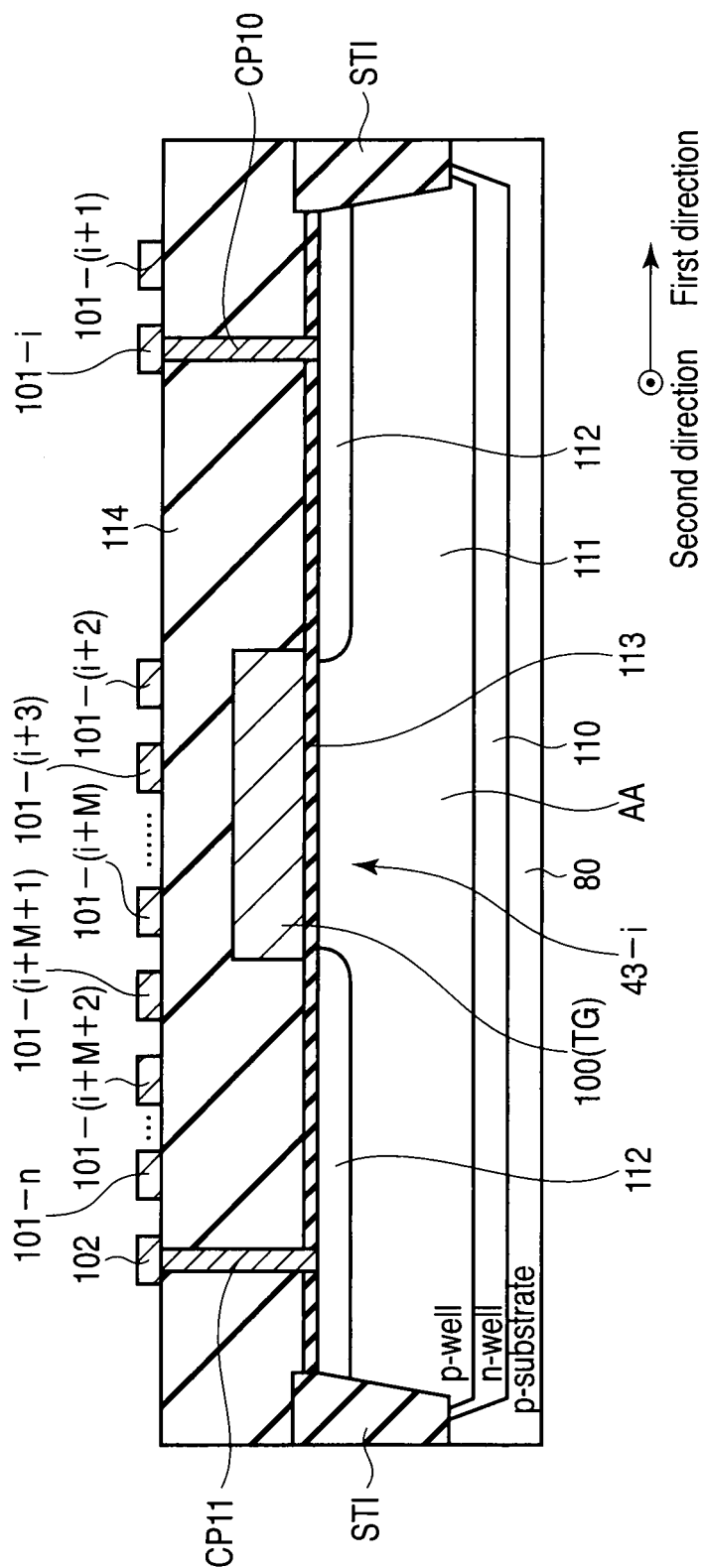
F I G. 12

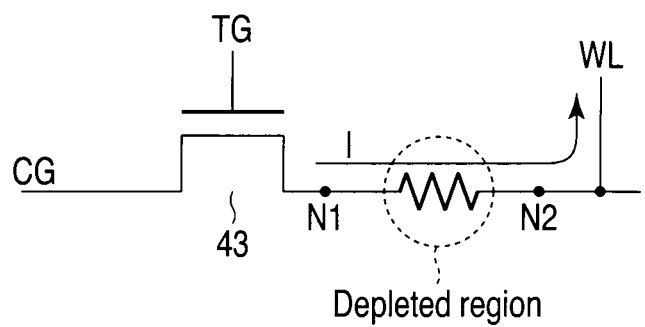
F I G. 13
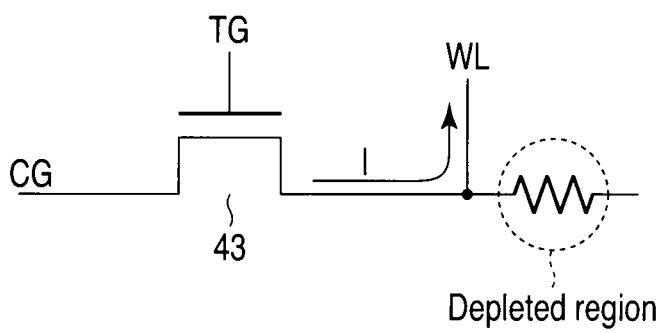
F I G. 14

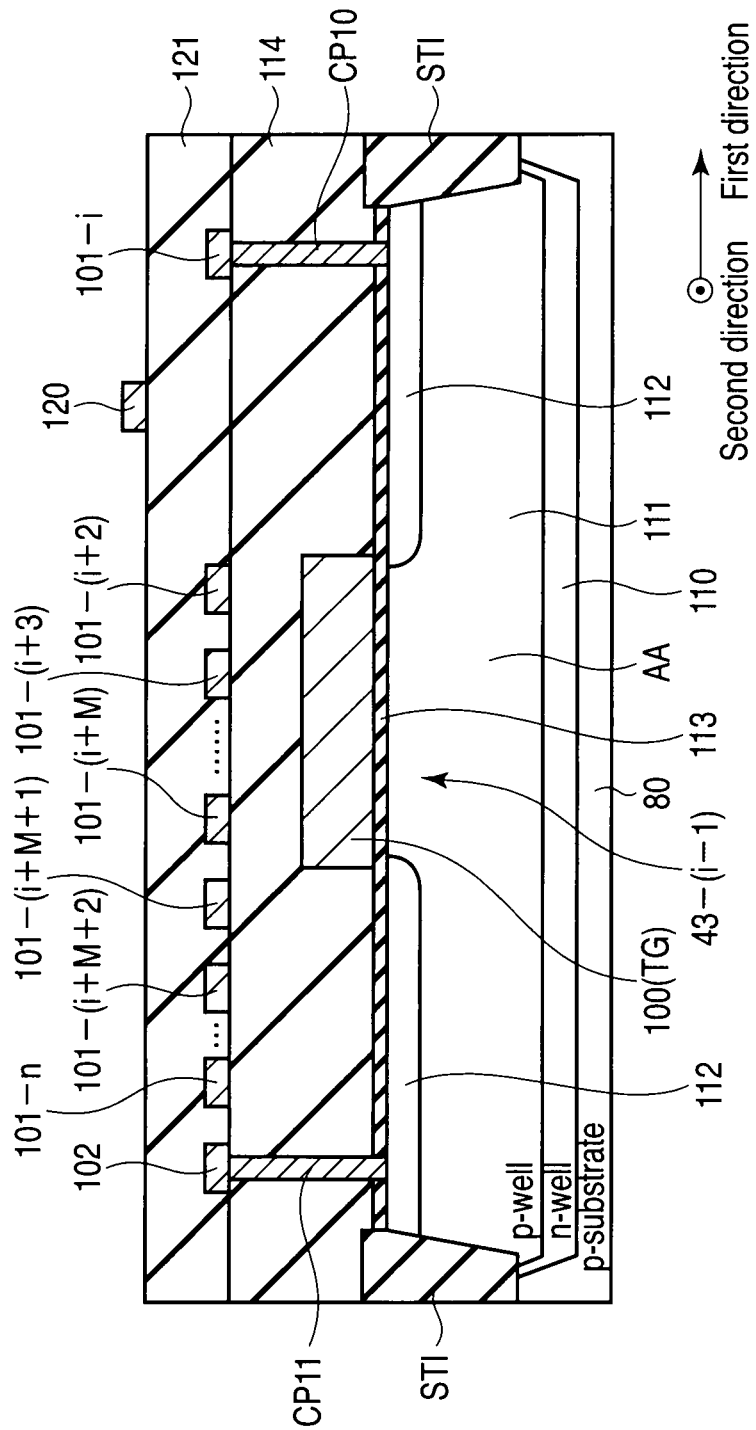
F I G. 16

SEMICONDUCTOR MEMORY DEVICE WITH MEMORY CELLS EACH INCLUDING A CHARGE ACCUMULATION LAYER AND A CONTROL GATE

CROSS-REFERENCE TO RELATED APPLICATIONS

This application is based upon and claims the benefit of priority from prior Japanese Patent Application No. 2009-019678, filed Jan. 30, 2009, the entire contents of which are incorporated herein by reference.

BACKGROUND OF THE INVENTION

1. Field of the Invention

This invention relates to a semiconductor memory device. More particularly, this invention relates to a semiconductor memory device with memory cells each including a charge accumulation layer and a control gate.

2. Description of the Related Art

An electrically erasable and programmable ROM (EEPROM) has been known as a nonvolatile semiconductor memory capable of rewriting data electrically. In addition, a NAND flash memory has been known as an EEPROM capable of high capacity and high integration.

In a NAND flash memory, it is necessary to apply a high voltage to a word line to write or erase data. Therefore, the NAND flash memory is provided with a row decoder including a transfer transistor for transferring a high voltage to the word line. Such a configuration has been disclosed in Jpn. Pat. Appln. KOKAI Publication No. 2002-63795.

BRIEF SUMMARY OF THE INVENTION

A semiconductor memory device according to an aspect of the present invention includes:

a memory cell unit in which an (N+1) number of memory cells (N is a natural number not less than 1), including charge accumulation layers and control gates formed on the charge accumulation layers, are connected in series;

an (N+1) number of word lines connected to the control gates of 0-th to N-th memory cells connected in series in a one-to-one correspondence;

a driver circuit which supplies a voltage to the memory cells; and an (N+1) number of first transistors which are formed on (N+1) number of element regions provided in a semiconductor substrate, include gate electrodes formed above the element regions with gate insulating films interposed therebetween, and transfer the voltage to the word lines respectively, each of the first transistors including two impurity diffused layers which are formed at the surface of one of the element regions and one of which is connected to the driver circuit and the other of which is connected to one of the word lines, wherein the (N+1) number of element regions are electrically separated from one another and the gate electrodes are connected in common, and above one of the first transistors which transfers the voltage to an i-th (i is a natural number in the range of 0 to N) word line, M (M<N) of the word lines close to the i-th word line pass through a region above the gate electrode by a first level interconnection without passing over the impurity diffused layers.

BRIEF DESCRIPTION OF THE SEVERAL VIEWS OF THE DRAWING

FIG. 1 is a block diagram of a flash memory according to a first embodiment of the invention;

FIG. 5 is a plan view of a row decoder according to the first embodiment;

FIG. 6 is a sectional view taken along line 6-6 of FIG. 5;

FIG. 7 is a circuit diagram of a memory cell unit and a row decoder according to the first embodiment;

FIG. 12 is a plan view taken along line 12-12 of FIG. 11;

FIG. 13 is an equivalent circuit diagram of a MOS transistor;

FIG. 14 is an equivalent circuit diagram of a MOS transistor according to the second embodiment;

FIG. 16 is a plan view taken along line 16-16 of FIG. 15.

DETAILED DESCRIPTION OF THE INVENTION

First Embodiment

Figure 2:
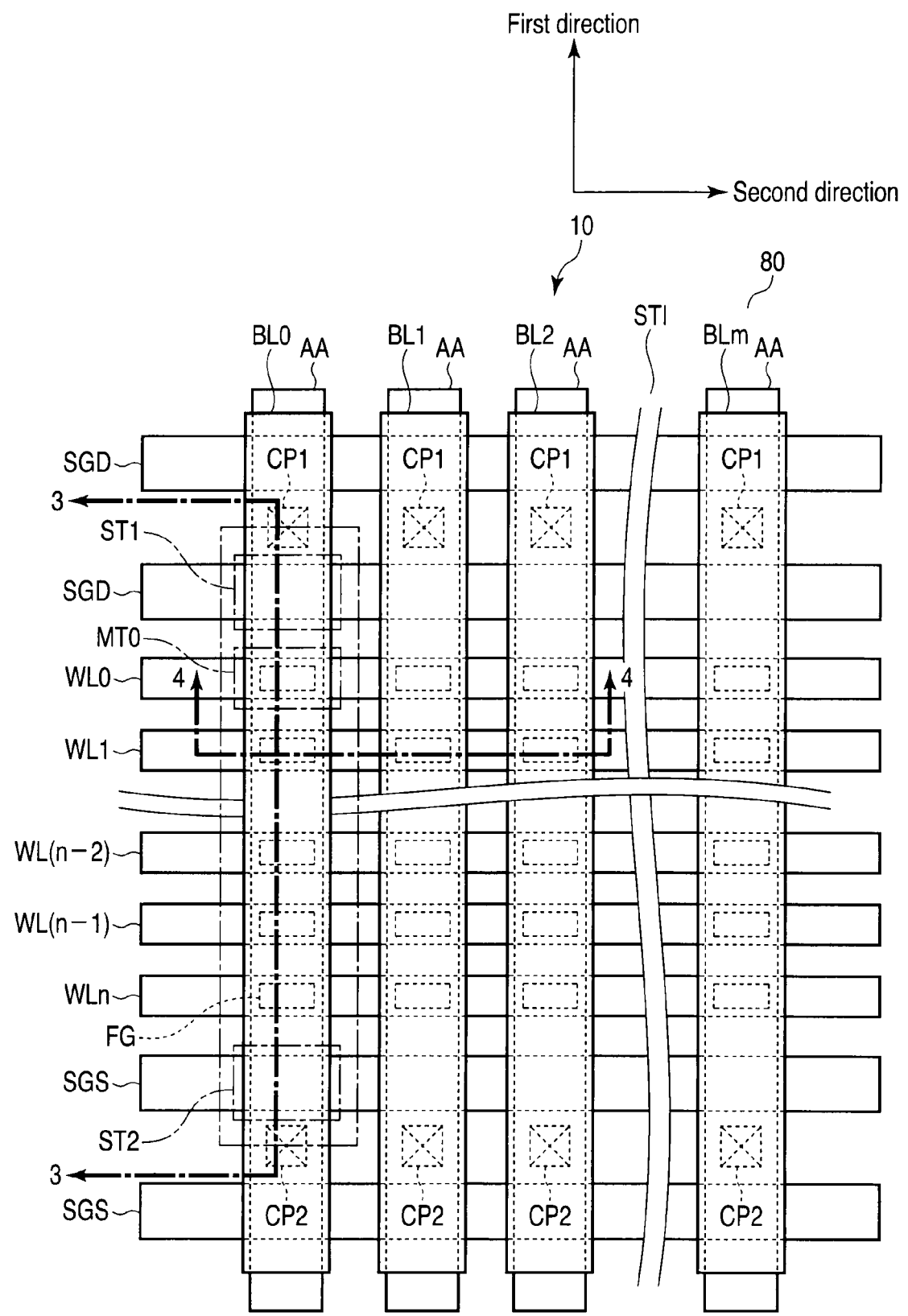
FIG. 2 is a plan view of a memory cell array according to the first embodiment.

A semiconductor memory device according to a first embodiment of the invention will be explained. FIG. 1 is a block diagram of a NAND flash memory according to the first embodiment.

<Overall Configuration of NAND Flash Memory>

As shown in FIG. 1, the NAND flash memory 1 includes a memory cell array 10, a sense amplifier 20, a source line driver 30, a row decoder 40, a driver circuit 50, a voltage generator circuit 60, and a control circuit 70.

The memory cell array 10 includes a plurality of memory cell units 11. Each of the memory cell units 11 includes an (n+1) number of memory cell transistors MT0 to MTn ((n+1) is a natural number not less than 2) and select transistors ST1, ST2. When there is no need to distinguish between memory cell transistors MT0 to MTn, they will simply be referred to as memory cell transistors MT. The number of memory cell transistors MT is, for example, 8, 16, 32, 64, 128, or 256, and is nonlimiting. Each of memory cell transistors MT has a stacked gate structure including a charge accumulation layer (e.g., a floating gate), formed on a semiconductor device with a gate insulating film interposed therebetween, and a control gate, formed on the charge accumulation layer with an intergate insulating film interposed therebetween. Adjacent memory cell transistors MT share a source and a drain. The memory cell transistors MT are arranged between select transistors ST1, ST2 in such a manner that their current paths are connected in series. The drain region on one end side (memory cell transistor MT0) of the memory cell transistors MTs connected in series is connected to the source of select transistor ST1 and the source region on the other end side (memory cell transistor MTn) is connected to the drain of select transistor ST2.

The control gates of memory cell transistors MT0 to MTn in the same row are connected to any one of word lines WL0 to WLn in a common connection manner. The gates of select transistors ST1 of the memory cells in the same row are connected to a select gate line SGD in a common connection manner. The gates of select transistors ST2 of the memory cells in the same row are connected to a select gate line SGS in a common connection manner. To simplify the explanation, word lines WL0 to WLn will sometimes simply be referred to as word lines WL.

A plurality of memory cell units 11 connected to the same word line WL and select gate lines SGD, SGS form a memory block. Data is erased in memory blocks simultaneously. In addition, data is written simultaneously into a plurality of memory cell transistors MT connected to the same word line WL. This writing unit is called a page.

Although not shown in FIG. 1, a plurality of memory blocks is arranged in a direction perpendicular to the word line WL. The drains of select transistors ST1 in the same column are connected to any one of bit lines BL to BLm (m is a natural number) in a common connection manner. Bit lines BL0 to BLm will sometimes simply be referred to as bit lines BL. The sources of select transistors ST2 are connected to a source line SL in a common connection manner. Both of the select transistors ST1, ST2 are not necessarily needed. Only one of the select transistors ST1, ST2 may be used, provided that the memory cell unit 11 can be selected.

Sense amplifier 20, in a read operation, senses data read from a memory cell transistor MT onto a bit line BL and amplifies the data. In a write operation, sense amplifier 20 transfers write data to a bit line BL. More specifically, sense amplifier 20 applies a voltage corresponding to write data to a bit line BL.

Source line driver 30 applies a voltage to the source line SL.

Row decoder 40 includes MOS transistors 41, 42 provided for select gate lines SGD, SGS respectively, MOS transistors 43-0 to 43-n provided for word lines WL0 to WLn respectively, and a block decoder 44.

One end of the current path of MOS transistor 41 is connected to select gate line SGD. One end of the current path of MOS transistor 42 is connected to select gate line SGS. The other ends of MOS transistors 41, 42 are connected to signal lines SGDD, SGSD, respectively.

One end of each of MOS transistors 43-0 to 43-n is connected to the corresponding one of word lines WL0 to WLn. The other end of each of MOS transistors 43-0 to 43-n is connected to the corresponding one of signal lines CG0 to CGn. That is, MOS transistors 41, 42 function as transfer transistors that transfer the potentials on signal lines SGDD, SGSD to select gate lines SGD, SGS, respectively. MOS transistors 43-0 to 43-n function as transfer transistors that transfer the potentials on signal lines CG0 to CGn to word lines WL0 to WLn, respectively. Hereinafter, when there is no need to distinguish between MOS transistors 43-0 to 43-n, they will simply be referred to as MOS transistors 43. In addition, when there is no need to distinguish between signal lines CG0 to CGn, they will simply be referred to as signal lines CG. The gates of MOS transistors 41 to 43 connected not only to select gate lines SGD, SGS connected to select transistors ST1, ST2 and memory cell transistors MT but also to word lines WL in the same memory block are connected to the same signal line TG.

Block decoder 44 externally receives a block address and decodes the block address. Then, block decoder 44 selects signal line TG to which MOS transistor 43 corresponding to memory cell unit 11 that includes a selected memory cell transistor to be written into, read from, or erased from is connected, thereby turning on MOS transistors 41 to 43.

Driver circuit 50 supplies a voltage necessary to write, read, or erase data to signal line SGDD, SGSD, and CG according to the result of decoding the page address. Those voltages are generated by the voltage generator circuit 60. The voltages applied to signal lines SGDD, SGSD, and CG will be described in detail later.

Control circuit 70 externally receives a command and controls the operation of the voltage generator circuit 60 according to the command. That is, in a write, read, or erase operation, or the like, control circuit 70 instructs voltage generator circuit 60 to generate a suitable voltage.

Voltage generator circuit 60 includes a charge pump circuit. According to the instruction given by control circuit 70, voltage generator circuit 60 generates a voltage necessary to write, read, or erase data and supplies the generated voltage to driver circuit 50.

<Configuration of Memory Cell Array 10>

Next, the configuration of memory cell array 10 will be explained in detail.

<Planar Configuration>

First, a planar configuration of memory cell array 10 will be explained with reference to FIG. 2. FIG. 2 is a plan view of memory cell array 10.

As shown in FIG. 2, in a semiconductor substrate 80, a plurality of strips of element regions AA extending in a first direction is also provided in a second direction, perpendicular to the first direction. An element isolating region STI is formed between adjacent element regions AA. The element isolating regions STI electrically separate the element regions AA from one another. On the semiconductor substrate 80, the strips of word lines WL and select gate lines SGD, SGS extending in the second direction are formed so as to cross a plurality of element regions AA. Floating gates FG are provided in the regions where word lines WL cross element regions AA. Although the width of floating gate FG is narrower than that of element region AA in FIG. 2, the width of floating gate FG may be equal to or greater than the width of element region AA. Memory cell transistors MT are provided in the regions where word lines WL cross element regions AA. In the region where select gate lines SGD cross element regions AA, select transistors ST1 are provided. In the region where select gate lines SGS cross element regions AA, select transistors ST2 are provided. In element regions AA between adjacent word lines WL, between adjacent select gate lines, and between a word line and a select gate line adjacent in the first direction, impurity diffused layers serving as the source regions or drain regions of memory cell transistors MT and select transistors ST1, ST2 are formed.

An impurity diffused layer formed in element region AA between adjacent select gate lines SGD in the first direction functions as the drain region of select transistor ST1. On the drain region, a contact plug CP1 is formed. Contact plug CP1 is connected to a bit line BL strip extending in the first direction. An impurity diffused layer formed in element region AA between adjacent select gate lines SGS in the first direction functions as the source region of select transistor ST2. On the source region, a contact plug CP2 is formed. Contact plug CP2 is connected to a source line (not shown).

<Cross-Section Configuration>

Figure 3:
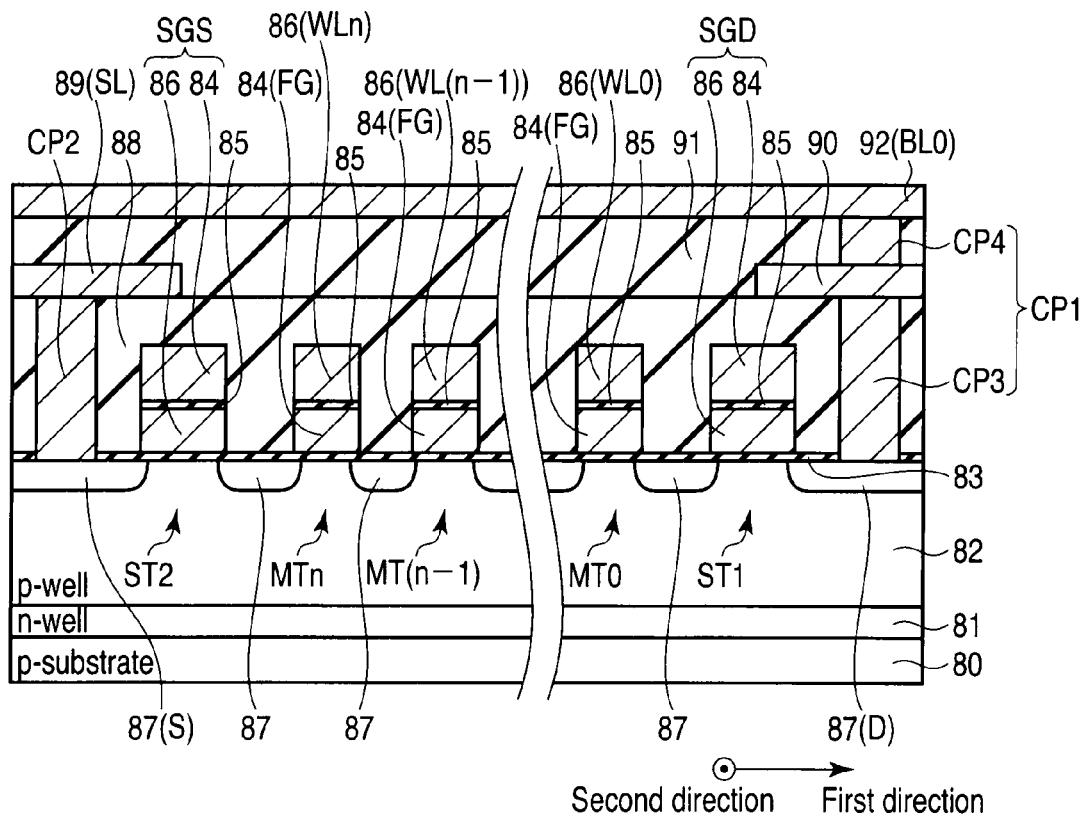
FIGS. 3 and 4 are sectional views taken along line 3-3 and line 4-4 of FIG. 2, respectively.
Figure 4:
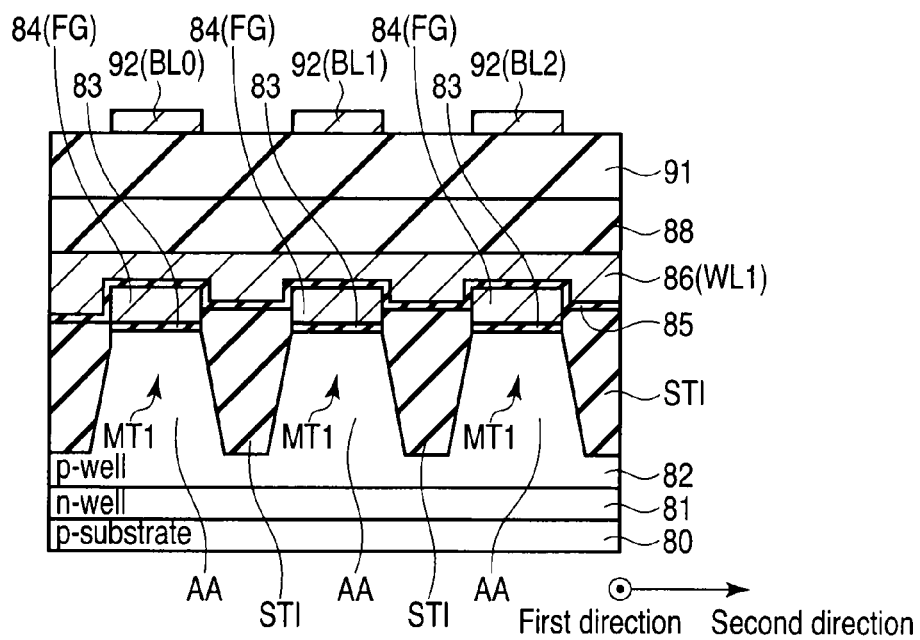

Next, a cross-section configuration of memory cell unit 11 will be explained with reference to FIGS. 3 and 4. FIG. 3 is a sectional view taken along line 3-3 of FIG. 2. FIG. 4 is a sectional view taken along line 4-4 of FIG. 2.

As shown in FIGS. 3 and 4, an n-well region 81 is formed at the surface of a p-type semiconductor substrate 80 and a p-well region 82 is formed at the surface of the n-well region 81. At the surface of the p-well region 82, a plurality of strips of element isolating regions STI extending in the first direction are also formed in the second direction. As a result, a strip of element regions AA extending in the first direction is formed, being surrounded by element isolating regions STI.

On the element isolating region AA, a gate insulating film 83 is formed. On the gate insulating film 83, the gate electrodes of the memory cell transistors MT and select transistors ST1, ST2 are formed. Each of the gate electrodes of the memory cell transistors MT and select transistors ST1, ST2 includes a polysilicon layer 84 formed on the gate insulating film 83, an inter-gate insulating film 85 formed on the polysilicon layer 84, and a polysilicon layer 86 formed on the inter-gate insulating film 85. The inter-gate insulating film 85 is formed by using of, for example, a silicon dioxide film, or an ON, an NO, or an ONO film which have a stacked structure of a silicon dioxide film and a silicon nitride film, or a stacked structure including those, or a stacked structure of a $TiO_2$, $HfO_2$, $Al_2O_3$, HfAlOx, or HfAlSi film and a silicon dioxide or a silicon nitride film.

In the memory cell transistors MT, the polysilicon layers 84 function as floating gates (FG). The polysilicon layers 86 adjacent in the second direction are connected to each other and function as a control gate (word line WL). In the select transistors ST1, ST2, the polysilicon layers 84, 86 adjacent in the second direction are connected to each other. The polysilicon layers 84, 86 function as select gate lines SGS, SGD. Only the polysilicon layers 84 may function as select gate lines. In this case, the polysilicon layers 86 of the select transistors ST1, ST2 are set at a specific potential or in a floating state. At the surface of the semiconductor substrate 80 between gate electrodes, an $n^+$-type impurity diffused layer 87 is formed. The impurity diffused layer 87, which is shared by adjacent transistors, functions as a source (S) or a drain (D). The region between a source and a drain adjacent to each other functions as a channel region serving as an electron moving region. These gate electrodes, impurity diffused layers 87, and channel regions form MOS transistors which function as memory cell transistors MT and select transistors ST1, ST2.

On the semiconductor substrate 80, an interlayer insulating film 88 is formed so as to cover the memory cell transistors MT and select transistors ST1, ST2. In the interlayer insulating film 88, a contact plug CP2 reaching the impurity diffused layer (source S) 87 of select transistor ST2 on the source side is formed. On the interlayer insulating film 88, a metal wiring layer 89 connected to the contact plug CP2 is formed. The metal wiring layer 89 functions as a source line SL. Further, in the interlayer insulating film 88, a contact plug CP3 reaching the impurity diffused layer (drain D) 87 of select transistor ST1 on the drain side is formed. On the interlayer insulating film 88, a metal wiring layer 90 connected to the contact plug CP3 is formed.

On the interlayer insulating film 88, an interlayer insulating film 91 is formed so as to cover the metal wiring layers 89, 90. In the interlayer insulating film 91, a contact plug CP4 reaching the metal wiring layer 90 is formed. On the interlayer insulating film 91, a metal wiring layer 92 connected to a plurality of contact plugs CP4 in common is formed. The metal wiring layer 92 functions as a bit line BL. The contact plugs CP3, CP4, and metal wiring layer 90 correspond to the contact plugs CP1 of FIG. 2.

<Detailed Configuration of Row Decoder 40>

Next, a detailed configuration of the row decoder 40 will be explained, particularly focusing on MOS transistor 43.

<Planar Configuration>

First, a planar configuration will be explained with reference to FIG. 5. FIG. 5 is a plan view of a region where MOS transistors 43 are formed in the row decoder 40.

As shown in FIG. 5, an (n+1) number of strips of element regions AA extending in the first direction are also provided in the second direction in the semiconductor substrate 80. Between element regions AA, element isolating regions STI are formed. The element regions AA are electrically separated by the element isolating regions STI. On each of the element regions AA, a MOS transistor 43 is formed.

Specifically, on each of the element regions AA, the gate electrode 100 of a MOS transistor 43 is formed so as to cross the individual element regions AA in the second direction. Further, in each of the element regions AA, impurity diffused layers serving as one and the other ends of the current path of the MOS transistor 43 are formed. Here, i in FIG. 5 is in the range of 0 to n. MOS transistors 43-0 to 43-n connected to the same memory block are arranged in a line in the second direction. The gate electrodes 100 of these MOS transistors are connected in common and function as a signal line TG. Accordingly, the gate electrodes 100 form strips extending in the second direction. In the example of FIG. 5, MOS transistors 43-0 to 43-n are arranged, starting with the one closest to the memory cell array 10. That is, MOS transistor 43-0 is provided closest to the memory cell array 10 and MOS transistor 43-n is provided farthest away from the memory cell array 10.

On one end of the current path of MOS transistor 34, a contact plug CP10 is formed. One end of the current path of MOS transistor 34 is connected via contact plug CP10 to a metal wiring layer (M0) 101 in a first level layer. The metal wiring layer (M0: first level interconnection) is a metal wiring layer in the lowest layer of the NAND flash memory 1. The metal wiring layer 101 is drawn to the boundary between the row decoder 40 and memory cell array 10 and connected to a word line WL. When it is necessary to distinguish between the metal wiring layers 101 connected to MOS transistors 43-0 to 43-n, they will be referred to as metal wiring layers 101-0 to 101-n. That is, metal wiring layers 101-0 to 101-n are connected to word lines WL0 to WLn, respectively. In other words, it may be said that metal wiring layers 101-0 to 101-n function as part of word lines WL0 to WLn.

The other end of the current path of MOS transistor 34 is connected to a metal wiring layer 102 in the first level layer via a contact plug CP11. The metal wiring layer 102 is connected to a metal wiring layer (M1: second level interconnection) 103 in a second level layer higher than the metal wiring layer (M0) via a contact plug CP12. The metal wiring layer 103 is connected to a metal wiring layer (M2: third level interconnection) 104 in a third level layer higher than the metal wiring layer in the second level layer via a contact plug CP13. The metal wiring layer 104, which functions as a signal line CG, has the form of a strip and extends in the first direction and passes through a region between adjacent element regions AA. The gate electrode 100 is connected to a metal wiring layer 105 in the first level layer with a contact plug CP14 and is connected to a block decoder 44 with the metal wiring layer 105.

In the first embodiment, a MOS transistor 43 connected to a word line WL closer to select gate line SGD is arranged closer to the memory cell array 10 in the row decoder 40. Accordingly, metal wiring layers 101-(i+1) to 101-n connected to MOS transistors 43-(i+1) to 43-n that transfer voltages to word lines WL(i+1) to WLn pass over MOS transistors 43-0 to 43-i that transfer voltages to word line WLi and word lines WL0 to WL(i−1). The word lines WL(i+1) to WLn is closer to select gate line SGS than a certain word line WLi is. The word line WL0 to WL(i−1) is closer to select gate line SGD than word line WLi is.

In this case, of metal wiring layers 101-(i+1) to 101-n, metal wiring layers 101-(i+1) to 101-(i+M) connected to an M number of word lines WL(i+1) to WL(i+M) (M is a natural number not less than 1) adjacent to word line WLi pass over the gate electrode 100 on an element region AA where MOS transistor 43-$i$ has been formed. Metal wiring layers 101-($i$+$M$+1) to 101-$n$ connected to the remaining word lines WL($i$+$M$+1) to WL$n$ pass over a region between contact plug CP11 (or CP10) and gate electrode 100.

Accordingly, as shown in FIG. 5, metal wiring layers 101 passing over the gate electrode 100 of each MOS transistor 43 is shifted at the position corresponding to each MOS transistor 43.

<Sectional Configuration>

Next, a sectional configuration of a MOS transistor 43 in the row decoder 40 will be explained with reference to FIG. 6. FIG. 6 is a sectional view taken along line 6-6 of FIG. 5.

As shown in FIG. 6, element isolating regions STI are formed in the surface of the p-type semiconductor substrate 80, thereby forming an element region AA surrounded by the element isolating regions STI. At the surface of the element region AA, an n-well region 110 is formed. In the surface region of n-well region 110, a p-well region 111 is formed. In the surface region of p-well region 111, two separate impurity diffused layers 112 are formed. The impurity diffused layers 112 function as the source or drain of MOS transistor 43.

Above p-well region 111 between impurity diffused layers 112, a gate electrode 100 of MOS transistor 43 is formed with a gate insulating film 113 interposed therebetween. Gate electrode 100 is formed of, for example, a polysilicon layer. The sectional configuration of gate electrode 100 has the same stacked structure as that of the gate electrode of each of select transistors ST1, ST2. The gate insulating film 113 is larger than the gate insulating film 83, which enables MOS transistor 43 to withstand a higher voltage than the memory cell transistors MT and select transistors ST1, ST2.

On the semiconductor substrate 80, an interlayer insulating film 114 is formed so as to cover MOS transistor 43 configured as described above. In the interlayer insulating film 114, a contact plug CP10 reaching one of the impurity diffused layers 112 and a contact plug CP11 reaching the other of the impurity diffused layers 112 are formed. On the interlayer insulating film 114, metal wiring layers 101-$i$ and 102, respectively in contact with contact plugs CP10 and CP11, are formed.

Further, on the interlayer insulating film 114, metal wiring layers 101-($i$+1) to 101-$n$ are formed so as to be sandwiched between metal wiring layers 101-$i$ and 102. Of them, metal wiring layers 101-($i$+1) to 101-($i$+M) are arranged in a region directly above gate electrode 100. The remaining metal wiring layers 101-($i$+M+1) to 101-$n$ are arranged in a region directly above the impurity diffused layer 112 in contact with contact plug CP11.

<Write Operation of NAND Flash Memory>

Next, a write operation of the NAND flash memory 1 configured as described above will be explained. Hereinafter, a case where charges are injected into charge accumulation layer 84 to raise the threshold voltage of the memory cell transistor MT is called a "0" program. In contrast, a case where no charge is injected into charge accumulation layer 84 to prevent the threshold voltage from changing (in other words, a case where the injection of charges is suppressed to a degree that the held data does not transit to another level) is called a "1" program. FIG. 7 is a circuit diagram of memory cell unit 11 and row decoder 40 in a write operation.

When data is written, voltage generator circuit 60 generates a high positive voltage VPGM and an intermediate voltage VPASS (<VPGM) under the control of control circuit 70. Voltage VPGM is a high voltage for injecting electrons into a charge accumulation layer by FN tunneling. Voltage VPASS is a voltage for turning on a memory cell transistor MT, regardless of held data.

Block decoder 44 decodes a block address and applies a "H"-level signal to the signal lines TG of MOS transistors 41 to 43 connected to the memory block including a memory cell transistor MT into which data is to be written (referred to as a selected cell). As a result, MOS transistors 41 to 43 turn on.

Furthermore, driver circuit 50 decodes a page address, selects signal line CG$i$, and applies voltage VPGM to signal line CG$i$. In addition, driver circuit 50 applies voltage VPASS to signal lines CG0 to CG($i$−1) closer to select gate line SGD than signal line CG$i$. Moreover, driver circuit 50 applies voltage VISO to any one of an M number of signal lines CG($i$+1) to CG($i$+M) adjacent to signal line CG$i$ and voltage VPASS to the rest. Driver circuit 50 further applies voltage VPASS to the remaining signal lines CG($i$+M+1) to CG$n$. Voltage VISO is a voltage for turning off a memory cell transistor MT, regardless of held data. Voltage VISO is, for example, 0 V. Hereinafter, a case where voltage VISO is applied to signal line CG($i$+1) will be explained as an example.

Driver circuit 50 further applies voltage VDD and 0 V to signal lines SGDD and SGSD, respectively. Voltage VDD is a voltage for causing select transistor ST1 to transfer "0" program data or preventing select transistor ST1 from transferring "1" program data. In other words, voltage VDD is a voltage that turns on select transistor ST1 at the time of the "0" program and turns it off at the time of the "1" program.

As a result, MOS transistors 41 and 42 transfer VDD and 0 V to select gate lines SGD and SGS, respectively. MOS transistor 43-$i$ transfers voltage VPGM to word line WL$i$ (selected word line). MOS transistor 43-($i$+1) transfers voltage VISO to word line WL($i$+1) (unselected word line). Moreover, MOS transistors 43-0 to 43-($i$−1), 43-($i$+2) to 43-$n$ transfer voltage VPASS to word lines WL0 to WL($i$−1), WL($i$+2) to WL$n$ (unselected word lines).

As described above, transferring the voltages to the word lines WL causes MOS transistors MT0 to MT$i$, MT($i$+2) to MT$n$ to turn on, forming a channel. In contrast, memory cell transistor MT($i$+1) goes off, forming no channel. That is, the channels of memory cell transistors MT0 to MT$i$ are conducting and the channels of memory cell transistors MT($i$+2) to MT$n$ are conducting. However, MOS transistors MT0 to MT$i$ and memory cell transistors MT($i$+2) to MT$n$ are separated by memory cell transistor MT($i$+1). Since 0 V is applied to select gate line SGS, select transistor ST2 is off. In contrast, select transistor ST1 turns on or off, depending on program data.

When the "0" program is executed, sense amplifier 20 applies a write voltage (e.g., 0 V) to a bit line BL. Accordingly, select transistor ST1 turns on, transferring 0 V applied to the bit line to the channels of memory cell transistors MT0 to MT$i$. Then, in the memory cell transistor MT$i$ connected to the selected word line WL$i$, the potential difference between the gate and channel is almost VPGM, with the result that charges are injected into charge accumulation layer 84. As a result, the threshold voltage of memory cell transistor MT$i$ rises, causing the "0" program to be executed.

When the "1" program is executed, sense amplifier 20 applies a write inhibit voltage (e.g., VDD) to a bit line, turning off select transistor ST1. Accordingly, the channels of memory cell transistors MT0 to MT$i$ in the memory cell unit 11 go into an electrically floating state. Then, the potentials at the channels of memory cell transistors MT0 to MT$i$ rise as a result of coupling with the gate potentials (VPGM, VPASS). Therefore, in memory cell transistor MT$i$ connected to the selected word line WL$i$, the potential difference between the gate and channel is insufficient, preventing charges from being injected into charge accumulation layer 84 (to a degree that the held data transits). As a result, the threshold voltage of memory cell transistor MTi remains unchanged, causing the "1" program to be executed.

<Effect>

As described above, the semiconductor memory device of the first embodiment can suppress a decrease in the voltage transfer capability of MOS transistor 43 and improve the operation reliability of the NAND flash memory 1. This effect will be explained below.

(1) Local Self-Boost

In the field of NAND flash memories, a method of writing data by a self-boost method has been known. The self-boost method is the technique for turning off select transistors ST1, ST2 of memory cell unit 11 including the MOS transistors MT that run the "1" program, thereby bringing the channels of the memory cell transistors MT included in the memory cell unit 11 into an electrically floating state, which raises the potentials at the channels by coupling with the word lines WL. As a result, in memory cell transistor MTi connected to the selected word line WLi, the potential difference between the gate and channel decreases, preventing charges from being injected into the charge accumulation layer, which causes the "1" program to be executed.

In the self-boost method, it is important to boost the channel potential efficiently. The reason for this is that, if the boost is insufficient, there is a possibility that the "0" program will be erroneously executed to the MOS transistors MT to which the "1" program is supposed to be executed. If self-boost is performed using data-written MOS transistors MT, the boost efficiency might decrease, depending on the data held in the MOS transistors MT.

As explained in FIG. 7, voltage VISO is applied to at least one of the unselected word lines (e.g., word line WL(i+1)). This unselected word line is closer to source line SL than the selected word line WLi is. The voltage VISO causes memory cell transistor MT(i+1) to go off. This prevents programmed memory cell transistors MT(i+2) to MTn closer to the source than memory cell transistor MT(i+1) from contributing to self-boost. Accordingly, the boost efficiency of the channels of memory cell transistors MT0 to MTi can be increased. This method is known as local self-boost.

(2) Miniaturization

In recent years, NAND flash memories have been miniaturized more and more and the size of one memory block has been reduced further. As a result, the size of a memory block in the direction of the bit line (or the length in the first direction) is almost equal to the size, in the gate length direction (or the length in the first direction), of an element region AA in which a MOS transistor 43 is formed. Alternatively, the size of a memory block (or the length in the first direction) is made less than twice the length, in the first direction, of the element region AA.

(3) Problem

When the local self-boost method is used in a NAND flash memory miniaturized as described above, a problem arises: the transfer capability of MOS transistor 43 decreases.

Specifically, although not shown in FIG. 5, a plurality of MOS transistors 43 are also arranged in the first direction. The memory block size becomes almost equal to the size of MOS transistor 43, with the result that the distance between adjacent MOS transistors 43 in the first direction becomes smaller.

It therefore becomes difficult to place the metal wiring layer 101 connecting MOS transistor 43 located far away from memory cell array 10 to a word line WL in a space between MOS transistors 43 in the first direction. Therefore, it is necessary to cause the metal wiring layer 101 to pass over MOS transistor 43 located near memory cell array 10.

In a case where the local self-boost method is used, when data is written, any one of the metal wiring layers 101 transfers voltage VISO. Voltage VISO is a low voltage, such as 0 V. When the metal wiring layer 101 transferring such a voltage passes over the impurity diffused layer 112 of MOS transistor 43, the impurity diffused layer 112 might be depleted. If the impurity diffused layer 112 has been depleted, its resistance value increases. As a result, the voltage transfer capability of MOS transistor 43 decreases.

This problem is particularly serious in MOS transistor 43 that transfers voltage VPGM. If voltage VPGM is not transferred sufficiently to the word lines WL, the word lines are written erroneously (or the "0" program cannot be written).

(4) First Embodiment

In the configuration of the first embodiment, when attention is focused on a certain word line WLi, metal wiring layers 101-($i$+1) to 101-($i$+M) in the first level layer connected to an M number of word lines WL(i+1) to WL(i+M) close to word line WLi on the source side (or SGS side) are arranged as follows. Metal wiring layers 101-($i$+1) to 101-($i$+M) are arranged so as to pass through the region above the gate electrode 100 without passing over the impurity diffused layer 112, when passing over MOS transistor 43-$i$ that transfers a voltage to word line WLi.

Accordingly, when voltage VPGM is applied to word line WLi, metal wiring layer 101, which transfers voltage VISO, passes over gate electrode 100 without passing over impurity diffused layer 112, above MOS transistor 43-$i$. Therefore, metal wiring layer 101 transferring voltage VISO is prevented from adversely affecting impurity diffused layer 112 of MOS transistor 43-$i$. That is, metal wiring layer 101 can prevent impurity diffused layer 112 from being depleted and the voltage transfer capability of MOS transistor 43-$i$ from decreasing.

Figure 8:
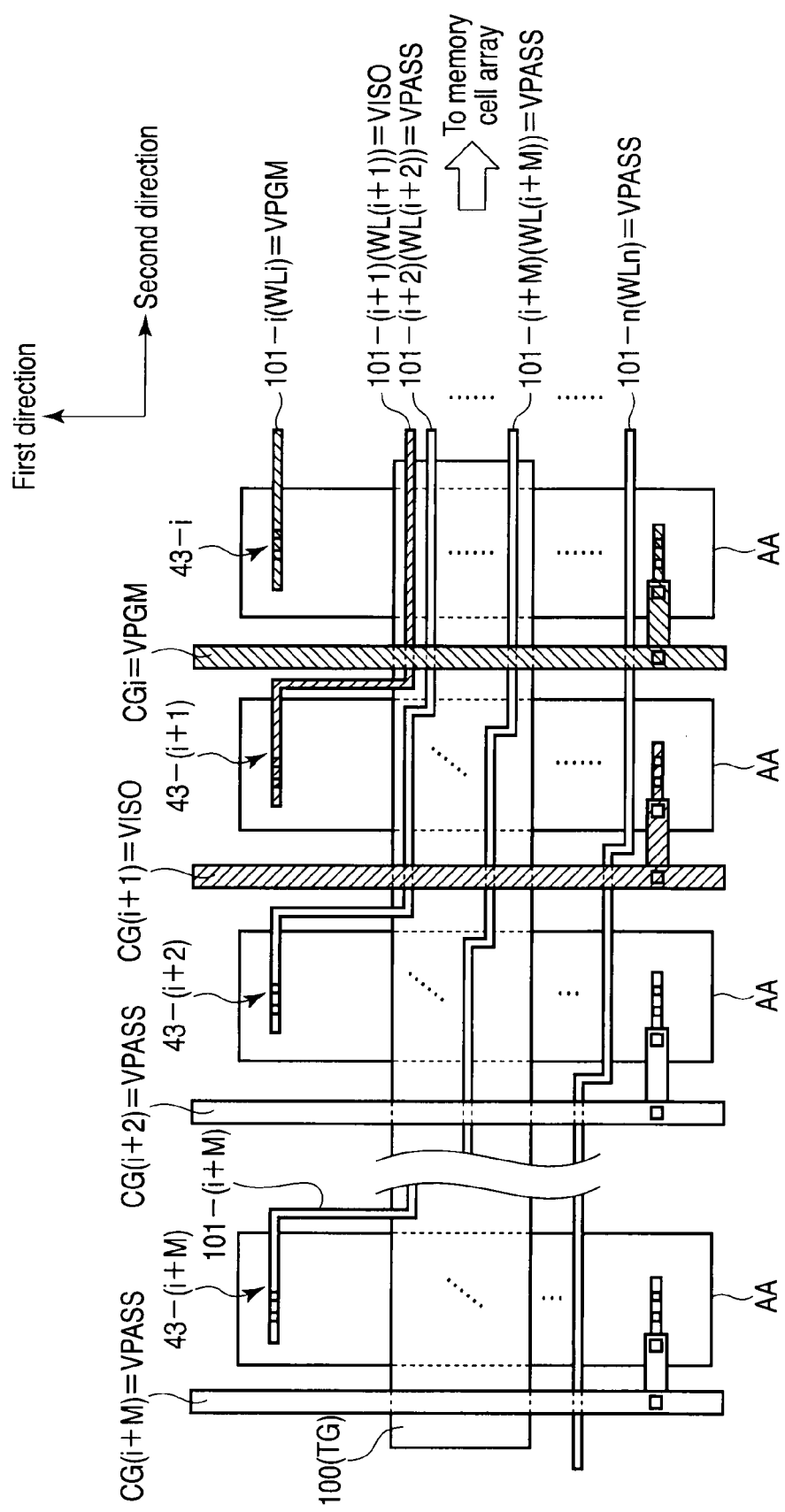
FIG. 8 is a plan view of a row decoder according to the first embodiment.

This will be explained with reference to FIG. 8. FIG. 8 is a plan view of MOS transistors 43-$i$ to 43-($i$+M).

As shown in FIG. 8, MOS transistor 43-$i$ transfers voltage VPGM to word line WLi. In this case, the word line WL to which voltage VISO is applied is any one of word lines WL(i+1) to WL(i+M). Any one of metal wiring layer 101-($i$+1) to 101-($i$+M) transfers voltage VISO. FIG. 8 shows a case where voltage VISO is applied to word line WL(i+1). In the layout of the first embodiment, metal wiring layers 101-($i$+1) to 101-($i$+M) pass over MOS transistor 43-$i$.

In the first embodiment, when metal wiring layers 101-($i$+1) to 101-($i$+M) pass over MOS transistor 43-$i$, they pass over gate electrode 100 without passing over impurity diffused layer 112. Accordingly, even when any one of metal wiring layer 101-($i$+1) to 101-($i$+M) transfers voltage VISO, the impurity diffused layer 112 of MOS transistor 43-$i$ transferring voltage VPGM can be prevented from being depleted.

First Modification of First Embodiment

In the NAND flash memory, VISO can be applied to not only an M number of unselected word lines closer to the source (or SGS side) than the selected word line WL but also an M number of unselected word lines on the drain side (or SGD side).

In the layout of FIG. 5, metal wiring layers 101-0 to 101-(i−1) connected to word lines WL0 to WL(i−1) closer to the drain than the selected word line WLi do not pass over MOS transistor 43-i. Accordingly, there is no need to take these wiring lines into account.

Figure 9:
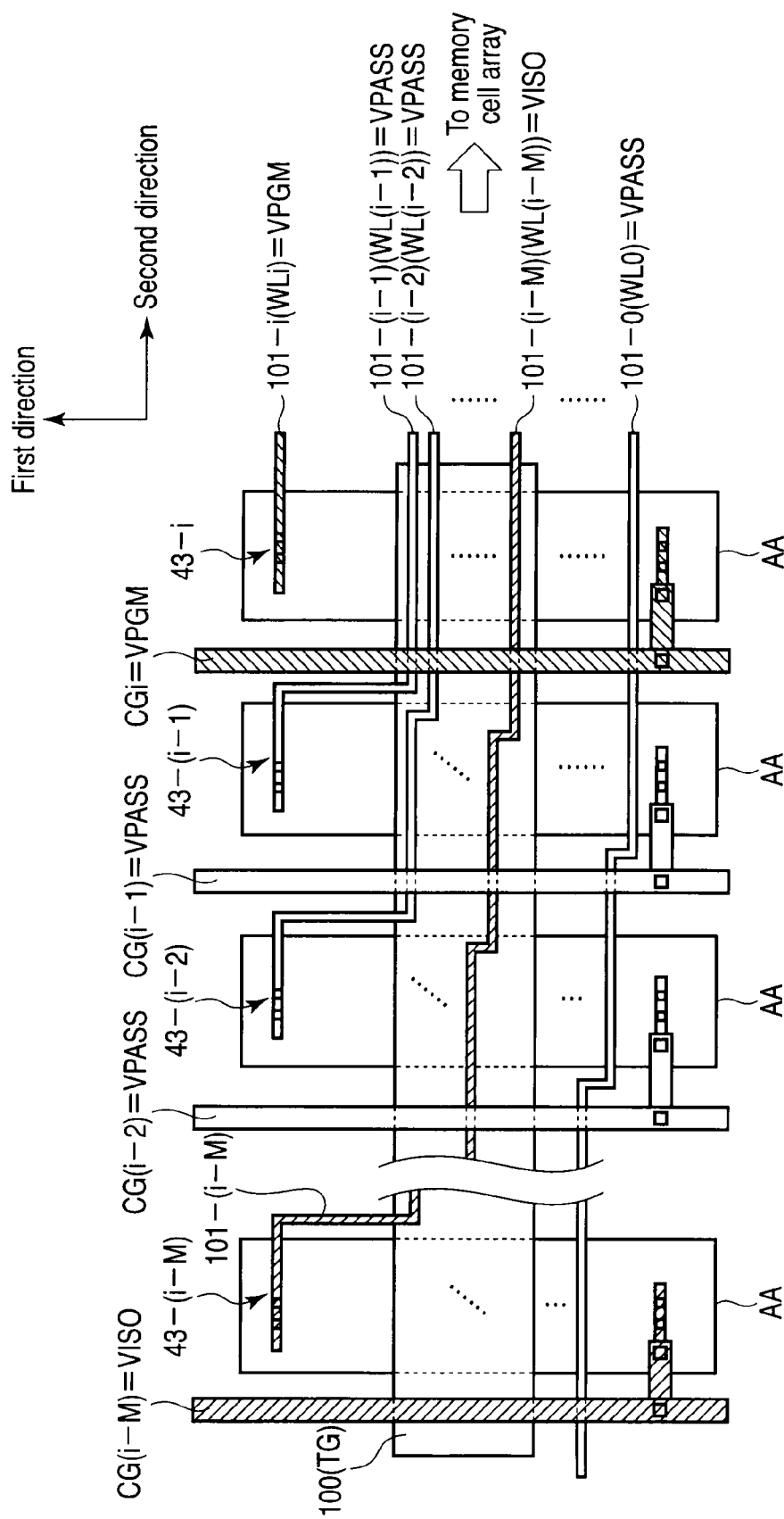
FIGS. 9 and 10 are plan views of a row decoder according to a first and a second modification of the first embodiment, respectively.

However, when metal wiring layers 101-0 to 101-(i−1) pass over MOS transistor 43-i, the wiring layers can be laid out as in the first embodiment. This example is shown in FIG. 9. FIG. 9 is a plan view of MOS transistors 43-i to 43-(i−M) according to a first modification of the first embodiment, showing a case where MOS transistor 43-i transfers voltage VPGM and MOS transistor 43-(i−M) transfers voltage VISO. In FIG. 9, the shaded regions are metal wiring lines that transfer voltage VPGM or voltage VISO.

As shown in FIG. 9, MOS transistors 43-0 to 43-n are arranged, starting from the one farthest away from memory cell array 10. That is, MOS transistor 43-n is located closest to memory cell array 10 and MOS transistor 43-0 is located farthest away from memory cell array 10. Accordingly, in this layout, metal wiring layers 101-0 to 101-(i−1) pass over MOS transistor 43-i.

Therefore, in this case, metal wiring layers 101-(i−M) to 101-(i−1) in the first level layer connected to an M number of word lines WL(i−M) to WL(i−1) close to word line WLi on the drain side are arranged as follows. When metal wiring layers 101-(i−M) to 101-(i−1) are arranged so as to pass through a region above gate electrode 100 without passing over impurity diffused layer 112, they pass over MOS transistor 43-i. With this arrangement, even when any one of metal wiring layers 101-(i−M) to 101-(i−1) transfers voltage VISO, they do not pass over impurity diffused layer 112 of MOS transistor 43-i transferring voltage VPGM, which prevents impurity diffused layer 112 from being depleted.

Furthermore, in the layout of FIG. 9, metal wiring layers 101-(i+1) to 101-n connected to word lines WL(i+1) to WLn closer to the source than the selected word line WLi do not pass over MOS transistor 43-i. Accordingly, there is no need to take these wiring lines into account.

Second Modification of First Embodiment

In FIGS. 5 and 9, MOS transistors 43-0 to 43-n have been arranged sequentially in the second direction in row decoder 40. However, MOS transistors 43-0 to 43-n are not necessarily arranged sequentially.

Figure 10:
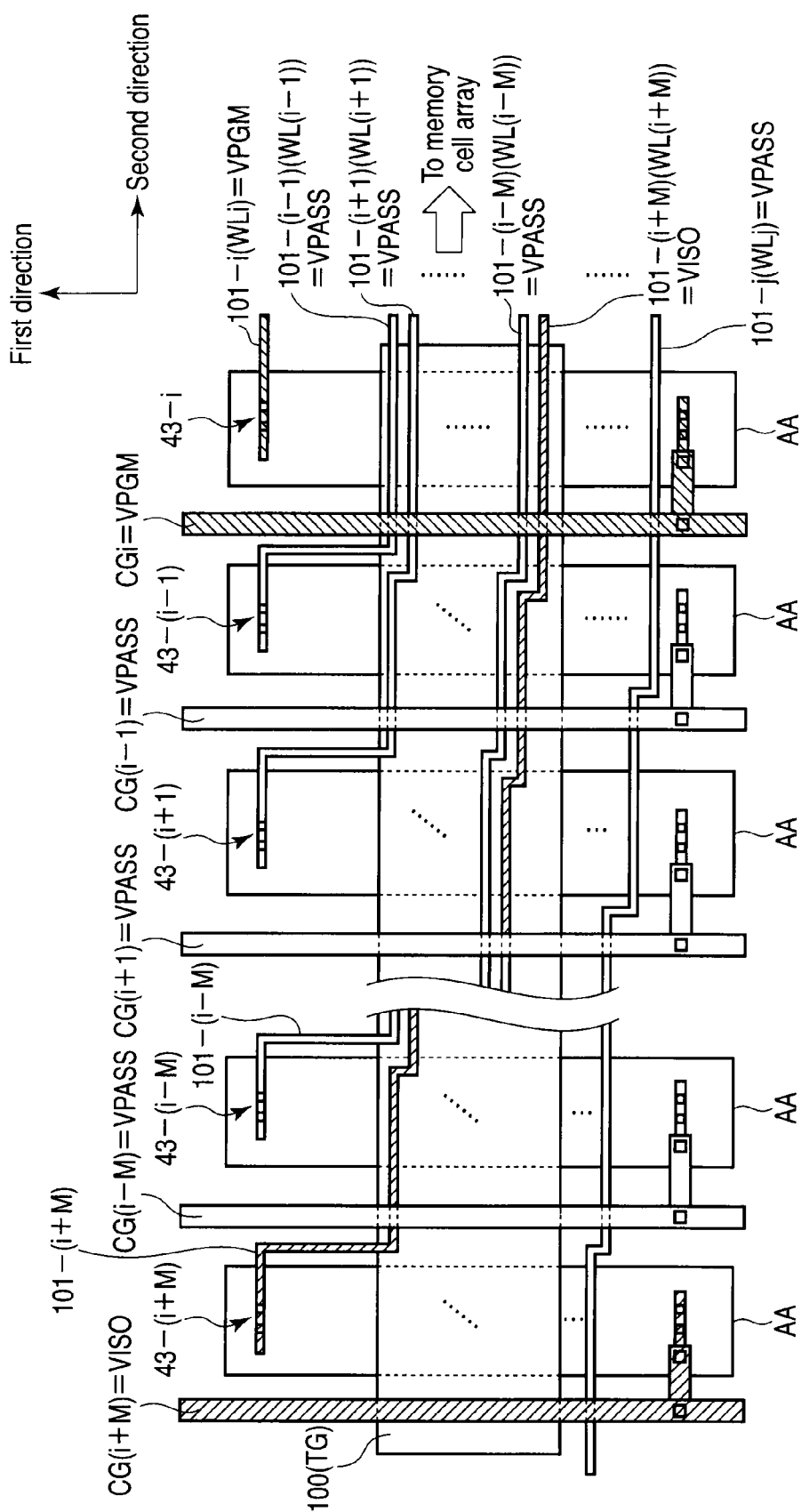

A layout in such a case will be explained with reference to FIG. 10. FIG. 10 is a plan view of MOS transistors 43-(i−M) to 43-(i+M) according to a second modification of the first embodiment, showing a case where MOS transistor 43-i transfers voltage VPGM and MOS transistor 43-(i+M) transfers voltage VISO. In FIG. 10, the shaded regions are metal wiring lines that transfer either voltage VPGM or VISO.

As shown in FIG. 10, MOS transistors 43-0 to 43-(i−1), 43-(i+1) to 43-(i+M) are arranged farther away from memory cell array 10 than MOS transistor 43-i. That is, metal wiring layers 101-(i−M) to 101-(i−1), 101-(i+1) to 101-(i+M) pass over MOS transistor 43-i.

In such a case, all of metal wiring layers 101-(i−M) to 101-(i−1), 101-(i+1) to 101-(i+M) are laid out as in the first embodiment. That is, metal wiring layers 1-1 (i−M) to 101-(i−1), 101-(i+1) to 101-(i+M) are arranged so as to pass through a region above gate electrode 100 without passing over impurity diffused layer 112, when they pass over MOS transistor 43-i. Accordingly, even when any one of metal wiring layers 101-(i−M) to 101-(i−1), 101-(i+1) to 101-(i+M) transfers voltage VISO, it does not pass over impurity diffused layer 112 of MOS transistor 43-i transferring voltage VPGM, which prevents impurity diffused layer 112 from being depleted.

In other words, in the configuration where voltage VISO can be applied to an M number of unselected word lines WL adjacent to the selected word line WLi, even if J lines (j is a natural number) of the M number of unselected word lines WL are located closer to the source line than the selected word line WLi and the remaining K lines (K=M−J) are located on the bit line side, the first embodiment can be applied.

Second Embodiment

Next, a semiconductor memory device according to a second embodiment of the invention will be explained. The second embodiment is such that any one of an M number of metal wiring layers 101 is provided on impurity diffused layer 112 in the first embodiment to locate the metal wiring layer in a region where no problem will arise even if the layer is depleted. Hereinafter, only parts that differ from the first embodiment will be explained.

In row decoder 40 according to the second embodiment, when attention is focused on a certain word line WLi, at least one of metal wiring layers 101-(i+1) to 101-(i+M) in the first level layer connected to an M number of word lines WL(i+1) to WL(i+M) closer to the source (or SGS side) than word line WLi is arranged as follows. At least one of metal wiring layers 101-(i+1) to 101-(i+M) is arranged so as to pass over impurity diffused layer 112 and outside contact plug CP10 in the element region AA when passing over MOS transistor 43-i that transfers a voltage to word line WLi. That is, at least one of metal wiring layers 101-(i+1) to 101-(i+M) is arranged so as to be on impurity diffused layer 112 of MOS transistor 43-i and face gate electrode 100, with contact plug CP10 intervening therebetween.

Figure 11:
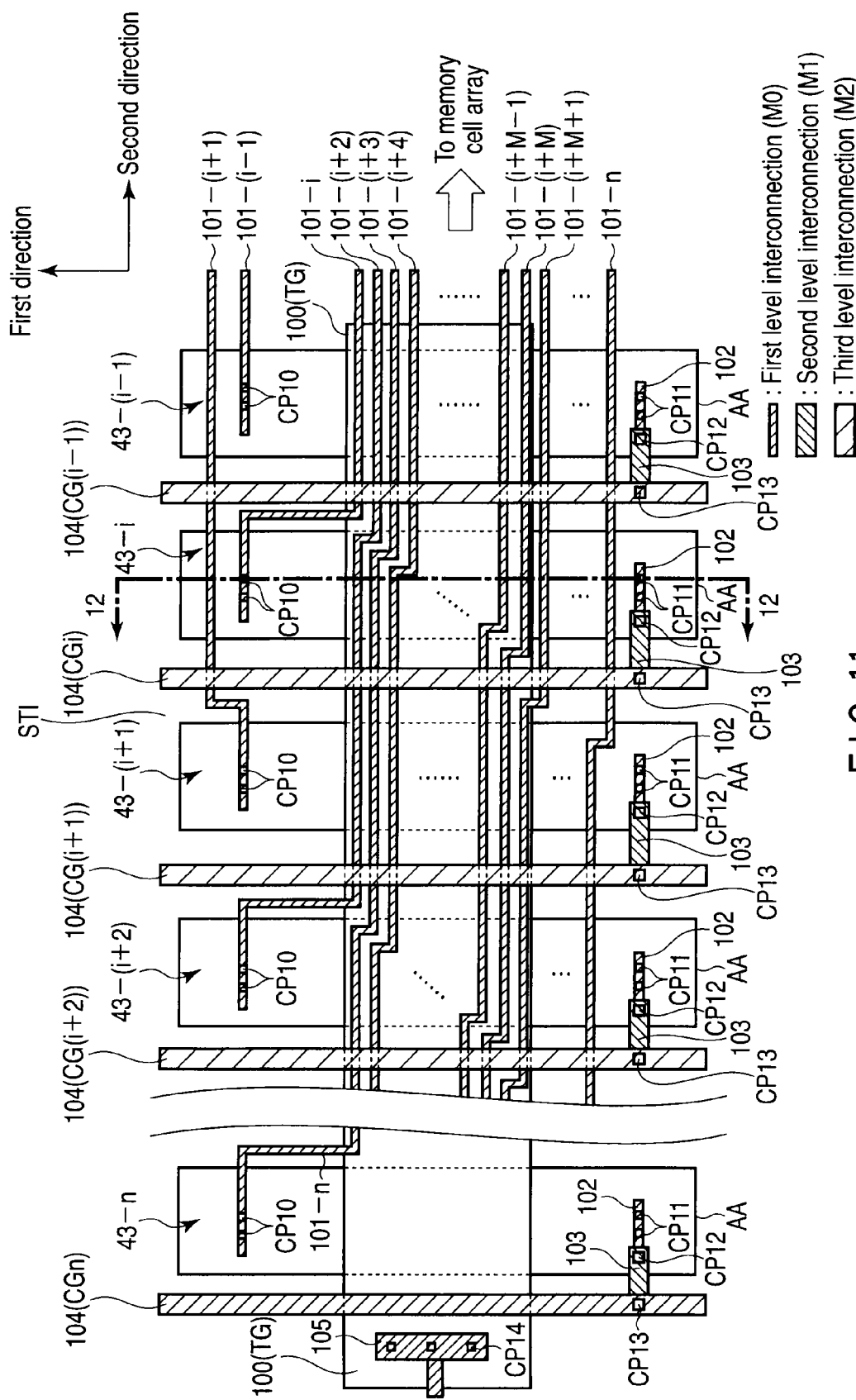
FIG. 11 is a plan view of a row decoder according to a second embodiment of the invention.

FIG. 11 is a plan view of a region where MOS transistors 43 are formed in row decoder 40 of the second embodiment, showing a case where metal wiring layer 101-(i+1) is laid out as described above. FIG. 12 is a sectional view taken along line 12-12 of FIG. 11. As shown in FIG. 11, metal wiring layer 101-(i+1) passes through a region outside contact plug CP10 on impurity diffused layer 112 of MOS transistor 43-i.

<Effect>

The configuration of the second embodiment can also prevent the voltage transfer capability of MOS transistor 43 from decreasing and produce the same effect as that of the first embodiment. The effect will be explained below.

FIG. 13 shows an equivalent circuit of MOS transistor 43 when metal wiring layer 101 transferring voltage VISO is on the MOS transistor 43 and passes through a region between contact plug CP10 (or CP11) and gate electrode 100.

As shown in FIG. 13, the region between contact plug CP10 (or CP11) and gate electrode 100 corresponds to the current path from a signal line CG to a word line WL. Accordingly, when depletion has occurred as a result of metal wiring layer 101 passing over the region, the resistance value of the current path increases. That is, a large voltage drop occurs between node N1 and node N2 in FIG. 13, making it impossible to transfer a sufficient voltage to the word line WL.

With the configuration of the second embodiment, however, metal wiring layer 101 transferring voltage VISO is on the MOS transistor 43 and passes outside contact plug CP10 (or CP11). FIG. 14 shows an equivalent circuit of MOS transistor 43 in this case. As shown in FIG. 14, the region outside contact plug CP10 (or CP11) has no function as a current path between the signal line CG to word line WL. Accordingly, even if the resistance value of the region increases, the effect on voltage transfer can be neglected. Therefore, the transfer capability of MOS transistor 43 can be secured sufficiently.

The second embodiment can be applied to FIGS. 9 and 10 explained in the first and second modifications of the first embodiment. Specifically, in FIG. 9, any one of metal wiring layers 101-(i–M) to 101-(i–1) may be caused to pass over impurity diffused layer 112 of MOS transistor 43-i and outside contact plug CP10 (or CP11). Moreover, in FIG. 10, either metal wiring layers 101-(i–M) to 101-(i–1) or 101-(i+1) to 101-(i+M) may be caused to pass over impurity diffused layer 112 of MOS transistor 43-i and outside contact plug CP10 (or CP11).

Third Embodiment

Next, a semiconductor memory device according to a third embodiment of the invention will be explained. The third embodiment is such that a metal wiring layer in the second level layer is used as any one of an M number of metal wiring layers 101 in the first embodiment. Hereinafter, only parts that differ from the first embodiment will be explained.

In row decoder 40 according to the third embodiment, when attention is focused on a certain word line WLi, at least one of metal wiring layers 101-(i+1) to 101-(i+M) connected to an M number of word lines WL(i+1) to WL(i+M) close to word line WLi on the source side (or SGS side) is caused to pass over MOS transistor 43-i that transfers a voltage to word line WLi by a metal wiring layer 120 in the second layer. In this case, metal wiring layer 120 passes over impurity diffused layer 112 of MOS transistor 43-i.

Figure 15:
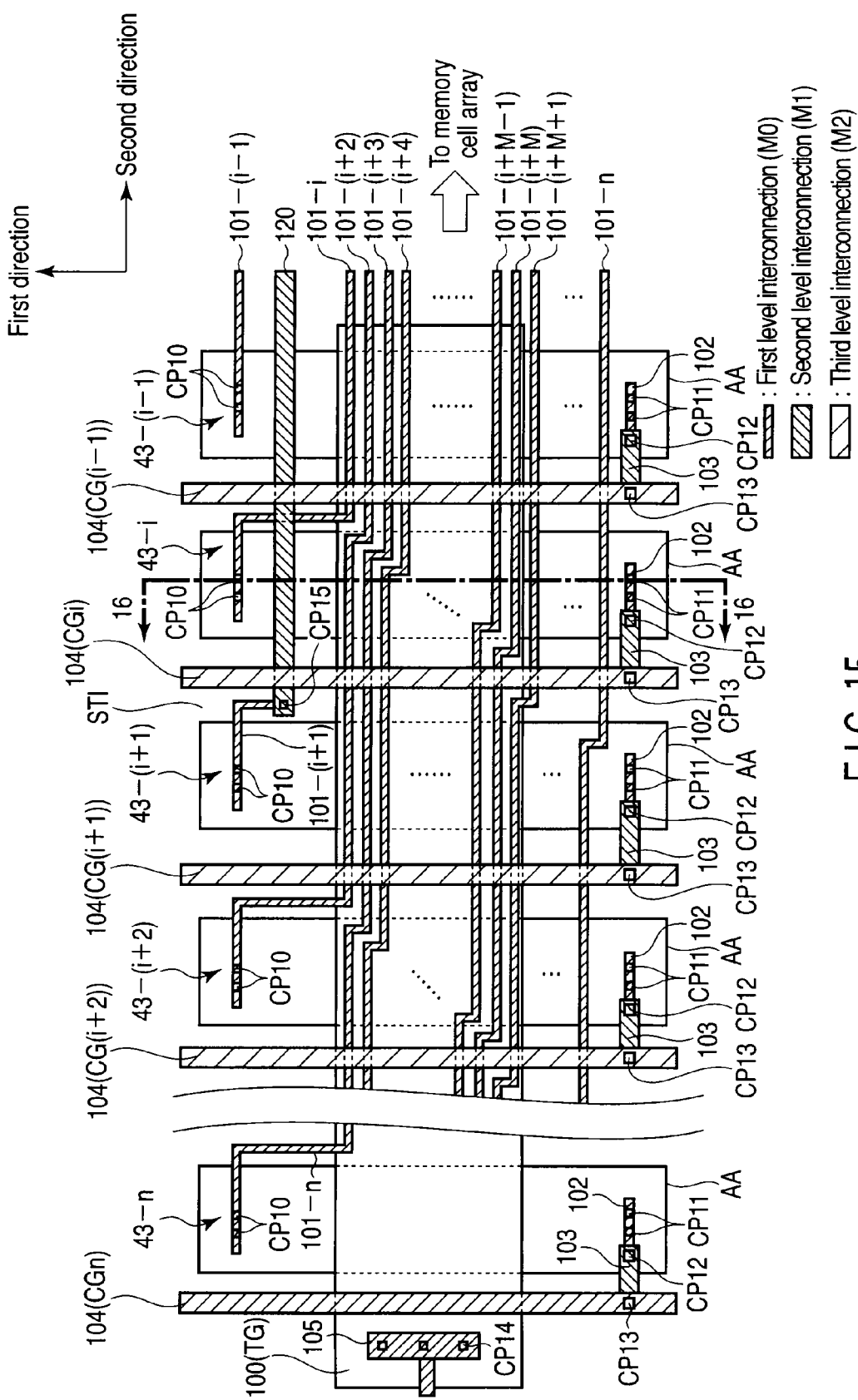
FIG. 15 is a plan view of a row decoder according to a third embodiment of the invention.

FIG. 15 is a plan view of a region where MOS transistors 43 are formed in row decoder 40 of the third embodiment, showing a case where metal wiring layer 101-(i+1) is laid out as described above. FIG. 16 is a sectional view taken along line 16-16 of FIG. 15.

As shown in FIG. 15 and FIG. 16, metal wiring layer 101-(i+1) is drawn from an element region AA onto an element isolating region STI and then is connected to metal wiring layer 120 in the second level layer via a contact plug CP15. Metal wiring layer 120, which has a strip form extending in the second direction, passes over MOS transistors 43-i to 43-0 and is drawn to the boundary between memory cell array 10 and row decoder 40. Then, metal wiring layer 120 is connected to word line WL(i+1). In this case, metal wiring layer 120 passes over the impurity diffused layers of MOS transistors 43-i to 43-0.

<Effect>

The configuration of the third embodiment can also prevent the voltage transfer capability of MOS transistor 43 from decreasing, and produce the same effect as that of the first embodiment. The effect will be explained below.

In the third embodiment, metal wiring layer 120 that transfers voltage VISO is second level wiring layer. Accordingly, as shown in FIG. 16, metal wiring layer 120 is separated from the surface of impurity diffused layer 12 by the sum of the film thicknesses of interlayer insulating film 114 and interlayer insulating film 121. Accordingly, even when metal wiring layer 120 transfers voltage VISO, the change of impurity diffused layer 112 into a depletion layer is suppressed. Therefore, the transfer capability of MOS transistor 43 can be secured sufficiently.

The third embodiment can be applied to FIGS. 9 and 10 explained in the first and second modifications of the first embodiment. Specifically, in FIG. 9, any one of metal wiring layers 101-(i–M) to 101-(i–1) may be passed over impurity diffused layer 112 of MOS transistor 43-i by the second level metal wiring layer 120. Moreover, in FIG. 10, either metal wiring layers 101-(i–M) to 101-(i–1) or 101-(i+1) to 101-(i+M) may be passed over impurity diffused layer 112 of MOS transistor 43-i by the second level metal wiring layer 120.

As described above, in a semiconductor memory device according to each of the first to third embodiments, MOS transistors 43 in row decoder 40 are arranged as described below. In the region above transfer transistor 43-i that transfers a voltage to word line WLi, an M number of word lines (M<N) close to an i-th word line WLi are arranged in any one of the following manners:

(1) The word lines are passed through a region above gate electrode 100 by a first level interconnection 101 without being passed through impurity diffused layer 112.

(2) The word lines are passed over impurity diffused layer 112 and through a region facing to gate electrode 100 with either the first contact plug CP10 or second contact plug CP11 intervening therebetween, by a first level interconnection 101.

(3) The word lines are passed over MOS transistor 43-i by a second level or more interconnection 120 which is located above the first level interconnection 101.

With this arrangement, impurity diffused layer 112 of MOS transistor 43 that transfers voltage VPGM can be prevented from having a higher resistance, and the operation reliability of the NAND flash memory can be improved.

In the second embodiment, metal wiring layer 101-(i–1) has passed outside contact plug CP10 on MOS transistor 43-i (see FIG. 11). However, metal wiring layer 101-(i–1) may pass outside contact plug CP11, depending on layout.

In the third embodiment, metal wiring layer 120 is not necessarily passed over impurity diffused layer 112 and may be passed over gate electrode 100. Moreover, metal wiring layer 120 can be third level interconnection or more.

Furthermore, in the second and third embodiments, one of an M number of word lines adjacent to word line WLi has passed outside contact plug CP10 or by second level interconnection 120. However, all of the M number of word lines may pass outside contact plug CP10 or by the second level interconnection 120.

In addition, the first to third embodiments may be combined suitably. Specifically, by combining the second and third embodiments, part of the M number of word lines adjacent to word line WLi may pass outside contact plug CP10 and the remaining ones may pass by the second level interconnection 120. Moreover, by combining the first and third embodiments, part of the M number of word lines adjacent to word line WLi may pass over gate electrode 100, another part may pass outside contact plug CP10, and the remaining ones may pass by the second level interconnection 120. Furthermore, not only the M number of word lines adjacent to word line WLi but also all the word lines WL passing over MOS transistor 34-i may be laid out as explained in the first to third embodiments.

While in the above embodiments voltage VISO has been 0 V, voltage VISO is not limited to 0 V. For instance, voltage VISO may be a positive voltage or a negative voltage, provided that voltage VISO can turn off the memory cell transistors MT. In addition, the memory cell transistors MT may have a MONOS structure where the charge accumulation layer 84 is formed by an insulating film instead of a conducting film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:
 a memory cell unit including a plurality of memory cells connected in series, the plurality of memory cells including charge accumulation layers and control gates;
 a plurality of word lines connected to the control gates of memory cells, the plurality of word lines including a first word line, a second word line, a third word line, a fourth word line, and a fifth word line, the fifth word line being adjacent to the first word line;
 a driver circuit configured to supply a voltage to the memory cells; and
 a plurality of transistors each including two impurity diffused layers, one of the two impurity diffused layers being connected to the driver circuit, the other of the two impurity diffused layers being connected to one of the word lines, the transistors including a first transistor and a second transistor, the first transistor being connected to the first word line, the second transistor being connected to the fifth word line,
 wherein when data is written into a memory cell connected to the first word line, a first voltage is applied to the first word line, a second voltage is applied to the second word line and the third word line, and a third voltage is applied to the fourth word line, the first voltage being larger than both the second voltage and the third voltage, the third voltage being larger than the second voltage, both the second word line and the third word line being located above gate electrodes of the first transistor and the second transistor without passing over the two impurity diffused layers of the first transistor and the two impurity diffused layers of the second transistor.

2. The device according to claim 1, wherein the memory cells include:
 a first memory cell connected to the first word line,
 a second memory cell connected to the second word line, and
 a third memory cell connected to the third word line,
 wherein the first memory cell is located between the second memory cell and the third memory cell.

3. The device according to claim 1, wherein the first transistor is formed on a first element region and the second transistor is formed on a second element region,
 each of the first and second transistors has a gate length in a first direction perpendicular to the word lines, and
 the first and second transistors are arranged in a second direction along the word lines.

4. The device according to claim 1, wherein the memory cells are connected between a first select transistor and a second select transistor,
 the memory cell unit is connected to a bit line via the first select transistor and connected to a source line via the second select transistor, and
 the transistors connected to the memory cells closer to the source line are arranged farther to the memory cell unit.

5. The device according to claim 4, wherein the second word line is adjacent to the first word line and is between the first word line and the source line.

6. The device according to claim 1, wherein the memory cells are connected between a first select transistor and a second select transistor,
 the memory cell unit is connected to a bit line via the first select transistor and connected to a source line via the second select transistor,
 the transistors connected to the memory cells closer to the source line are arranged closer to the memory cell unit, and
 the second word line is adjacent to the first word line and is between the first word line and the bit line.

7. The device according to claim 1, wherein the second voltage turns off a memory cell regardless of data held in the memory cell.

8. A semiconductor memory device, comprising:
 a memory cell unit including a plurality of memory cells connected in series, the plurality of memory cells including charge accumulation layers and control gates;
 a plurality of word lines connected to the control gates of memory cells, the plurality of word lines including a first word line, a second word line, and a third word line;
 a driver circuit configured to supply a voltage to the memory cells; and
 a plurality of transistors each including two impurity diffused layers, one of the two impurity diffused layers being connected to the driver circuit, the other of the two impurity diffused layers being connected to one of the word lines, the transistors including a first transistor connected to the first word line,
 wherein a contact plug is connected to the first transistor, the contact plug being formed on the other of the two impurity diffused layers,
 when data is written into a memory cell connected to the first word line, a first voltage is applied to the first word line, a second voltage is applied to the second word line, and a third voltage is applied to the third word line, the first voltage is larger than both the second voltage and the third voltage, and the third voltage is larger than the second voltage,
 the third word line is located a region above the other of the two impurity diffused layers of the first transistor, the third word line being located between the contact plug and a gate electrode of the first transistor, and
 the second word line is located above the gate electrode of the first transistor without passing over the two impurity diffused layers of the first transistor.

9. The device according to claim 8, wherein each of the transistors is formed on an element region,
 each of the transistors has a gate length in a first direction perpendicular to the word lines, and
 the transistors are arranged in a second direction along the word lines.

10. The device according to claim 8, wherein the memory cells are connected between a first select transistor and a second select transistor,
 the memory cell unit is connected to a bit line via the first select transistor and connected to a source line via the second select transistor, and
 the transistors connected to the memory cells closer to the source line are arranged farther to the memory cell unit.

11. The device according to claim 10, wherein the second word line is adjacent to the first word line and is between the first word line and the source line.

12. The device according to claim 8, wherein the memory cells are connected between a first select transistor and a second select transistor,
 the memory cell unit is connected to a bit line via the first select transistor and connected to a source line via the second select transistor, the transistors connected to the memory cells closer to the source line are arranged closer to the memory cell unit, and the second word line is adjacent to the first word line and is between the first word line and the bit line.

13. The device according to claim 8, wherein the second voltage turns off a memory cell regardless of data held in the memory cell.

14. The device according to claim 8, wherein the contact plug is connected to the driver circuit.

* * * * *